(12) United States Patent
Mei et al.

(10) Patent No.: US 6,697,228 B1
(45) Date of Patent: Feb. 24, 2004

(54) LOW STIFFNESS PITCH ADJUSTABLE SUSPENSION

(75) Inventors: Shijin Mei, Temecula, CA (US); Jorge Lepe, Temecula, CA (US); Warren Coon, Temecula, CA (US)

(73) Assignee: Magnecomp Corp., Temecula, CA (US)

( * ) Notice: Subject to any disclaimer, the term of this patent is extended or adjusted under 35 U.S.C. 154(b) by 212 days.

(21) Appl. No.: 09/970,295

(22) Filed: Oct. 2, 2001

Related U.S. Application Data
(60) Provisional application No. 60/308,033, filed on Jul. 25, 2001.

(51) Int. Cl.[7] .................................................. G11B 5/55
(52) U.S. Cl. .................................................... 360/245.3
(58) Field of Search ............................ 360/245.3, 245.5, 360/245.6

(56) References Cited

U.S. PATENT DOCUMENTS
6,118,637 A * 9/2000 Wright et al. ............ 360/294.4
6,587,311 B1 * 7/2003 Niijima et al. .............. 360/255

* cited by examiner

*Primary Examiner*—A. J. Heinz
(74) *Attorney, Agent, or Firm*—Louis J. Bachand

(57) ABSTRACT

Disk drive suspension pitch static attitude is adjusted without increasing the stiffness of the suspension by defining reliefs in the laterally projecting tab continuations of the suspension metal layer in the form of full or partial gaps, notches and/or apertures that reduce mass of the tabs while retaining their functionality for twisting or bending the suspension to bring the suspension slider-supporting tongue into parallel relation with a disk surface.

24 Claims, 3 Drawing Sheets

LOW STIFFNESS PITCH ADJUSTABLE SUSPENSION

RELATED APPLICATION

This application claims the benefit of U.S. Provisional Application Ser. No. 60/308,033, filed Jul. 25, 2001.

STATEMENT REGARDING FEDERALLY SPONSORED RESEARCH OR DEVELOPMENT

Not Applicable.

REFERENCE TO A MICROFICHE APPENDIX

Not Applicable.

BACKGROUND OF THE INVENTION

1. Field of the Invention

This invention relates to suspensions for disk drives, and more particularly to relates to improvements in the manufacture thereof, specifically in obtaining readily both faster and more accurate pitch static attitude adjustment in the course of manufacture. In an important aspect the invention provides optimally static attitude adjusted suspensions having a reduced stiffness to enable more precise compliance of the suspension with an opposing disk surface.

2. Description of the Related Art

Adjustment of the pitch static attitude of disk drive suspensions through the use of opposed clamps attached to lateral extensions on the suspension metal member is known, but such techniques have added mass and unwanted stiffness to the suspensions.

BRIEF SUMMARY OF THE INVENTION

It is an object of the invention, therefore, to achieve pitch static attitude adjustment of a suspension that brings the suspension flexure tongue into parallel position with an opposing disk surface through relative bending or twisting of the suspension flexure metal layer by integral lateral tabs while avoiding suspension stiffness increase normally accompanying the presence of such adjustment tabs. It is a further object to provide a suspension and a manufacturing adjustment method that has a facile adjustment of pitch static attitude and that, by locally reducing the mass of the tabs, avoids adding stiffness to the suspension.

These and other objects of the invention to become apparent hereinafter are realized in the invention low stiffness pitch adjustable suspension comprising a flexure and a flexure support, the flexure comprising a flexible circuit assembly of trace conductors, an insulative film and a metal support member for the assembly insulated from the trace conductors by the insulative film, the metal support member having a proximate end and a distal end, the distal end having a configuration determining the pitch attitude of the suspension, the distal end defining opposed left and right laterally projecting tab continuations of the distal end having longitudinally separated proximate and distal portions, the tab continuation proximate and distal portions being relatively adjustable to vary the distal end configuration in suspension pitch attitude adjusting relation, the tab continuations tending to stiffen the suspension, each the tab continuation being disposed within a generally rectangular perimeter, and each the tab continuation having within its the perimeter a local reduction in mass in suspension stiffness reducing relation.

In a further embodiment the invention provides a low stiffness pitch adjustable suspension comprising a flexure and a flexure support, the flexure comprising a flexible circuit assembly of trace conductors, an insulative film and a spring metal support member for the assembly insulated from the trace conductors by the insulative film, the metal support member having a proximate end and a distal end, the distal end having a configuration determining the pitch attitude of the suspension, the distal end defining opposed left and right laterally projecting tab continuations of the distal end having longitudinally separated proximate and distal portions, the tab continuation proximate and distal portions being separately adjustable to vary the distal end configuration in suspension pitch attitude adjusting relation, the tab continuations tending to stiffen the suspension, each the tab continuation being disposed within a generally rectangular perimeter, and each the tab continuation having within its the perimeter a local reduction in mass in suspension stiffness reducing relation, the localized mass reduction defining and separating the longitudinally separated proximate and distal portions.

In these and like embodiments, typically, each tab continuation is formed of the same web of metal as the metal support member, the suspension further comprises a load beam supporting the flexure metal support member, the flexure metal support member distal end comprises a frame having longitudinally extended left and right outriggers joined by a cross member and having a tongue cantilevered from the cross member, the outriggers defining the left and right tab continuations respectively, the suspension being adjusted to bring the tongue to a position to be substantially parallel to a disk drive suspension disk, the insulative film is a polyimide film, the trace conductors a copper metal, and the metal support member and load beam each a spring stainless steel, the tab continuation proximate portions define clamping areas for stationary clamps, and the tab continuation distal portions define clamping areas for movable clamps, whereby the tab continuation distal portions when clamped are shiftable relative to the tab continuation proximate portions to vary the metal support member distal end configuration and the suspension pitch attitude thereby, the tab continuations are locally mass reduced in region between their the proximate and distal portions, the tab continuations are e.g. locally surface-relieved or locally through-relieved in the region, thereby to reduce the tab continuation mass, and the tab continuation distal and proximate portions comprise separated fingers projecting laterally from the metal support member, adjacent fingers being defined and separated by a localized through relief in the tab continuation.

In its method aspects, the invention provides the method of adjusting the pitch static attitude of a disk drive suspension having a flexure comprising a frame with left and right longitudinally extending outriggers, a cross member connecting distal portions of the outriggers and a tongue carried in cantilevered relation from the cross member so as to be parallel with an opposing disk surface when the suspension pitch static attitude is properly adjusted, the method including defining first and second lateral tab continuations of the outriggers each having spaced, longitudinally adjacent distal and proximate portions, locally reducing the mass of the tab continuations to lower the stiffness of the suspension, fixing the proximate portions of the tab continuations at laterally opposed first locations, gripping the distal portions of the tab continuations at laterally opposed second locations, deflecting and bending the flexure between the first and second locations by the gripped distal portions against the restraining force of the fixed proximate portions to bring the pitch attitude of the suspension to a value at which the tongue will be parallel to a the disk surface, and more particularly locally reducing the mass of the tab continuations between the proximate and distal portions, locating the proximate portion rearwardly of the cross member, locating the distal portion forwardly of the cross member, and defining a gap between the proximate and distal portions in suspension stiffness reducing relation, and also supporting the flexure with a load beam.

BRIEF DESCRIPTION OF THE SEVERAL VIEWS OF THE DRAWINGS

The invention will be further described in conjunction with the attached drawings in which.

DETAILED DESCRIPTION OF THE INVENTION

As computer disk drive speeds increase, the slider flies closer to the disk surface and pitch static attitude adjustment becomes even more critical. A flexure tongue carries the slider containing the read-write head in spaced relation to the disk surface. The slider is desirably flat to the disk surface when being loaded; if it is not, it may strike the disk as it is loaded onto the disk. Whether or not the slider is at the desired orientation depends on the pitch static attitude of the suspension. To ensure proper orientation, the suspension is adjusted during manufacture to bring the slider-supporting tongue into parallel relation with the expected plane of the disk surface.

Pitch static attitude (PSA) adjustment is required when the pitch attitude bias changes during assembly of the head gimbal assembly and the flexure tongue is no longer parallel to the disk surface. Otherwise, the flexure tongue is non-parallel and an edge or corner of the slider supported thereby will contact the disk surface with damage resulting. Correcting the tongue orientation generally requires a pitch static attitude adjustment in which the suspension at the tongue region is bent or twisted to bring the flexure tongue into the desired parallel relation with a disk surface. Pitch static attitude adjustment is effect herein by holding the suspension stationary at a first locus and forcing the suspension at a second, adjacent locus into a different position so as to bring the tongue portion of the suspension into the desired orientation. Tab continuations define each of the first and second locuses. These tab continuations tend to unduly stiffen the suspension flexure and in the invention the tab continuations are modified by removal of surface or through areas thereof to reduce the mass of material comprising the tab continuations, and more generally to shape the tab continuations to reduce stiffness in the suspension. In a preferred embodiment, the invention uses bifurcated tab continuations, each having two tab portions that enable clamping by stationary jaws at the proximate pair of tab sections, and clamping by movable jaws at the distal pair of tab sections. The gap between the longitudinally adjacent tab portions on either side of the suspension decreases stiffness in the suspension. Stiffness can also be reduced by etching the tab continuations to a lesser thickness locally as need for stiffness reduction, or providing one or more apertures in the tab distal and proximate portions or therebetween that remove mass and change the stiffness imparted by the presence of the tab continuations.

Figure 1:
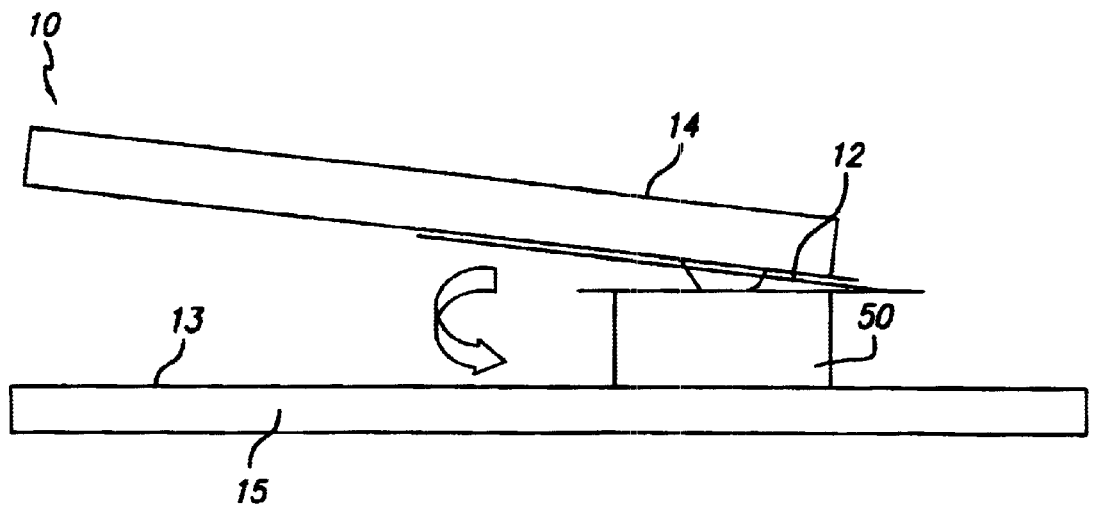
FIG. 1 is a side elevation view of a suspension and disk in operative association.

With reference now to the drawings in detail, in FIGS. 1–4 the invention low stiffness pitch adjustable suspension 10 is shown to comprise a flexure 12, and in the FIG. 1 embodiment a load beam 14 providing support to the flexure above the surface 13 of the disk 15. In all embodiments, flexure 12 comprises a flexible circuit assembly 16 of trace conductors 18, an insulative film 22, and a metal support member 24 for the assembly insulated from the trace conductors by the insulative film.

Flexure metal support member 24 has a proximate end 26 and a distal end 28. Distal end 28 has a configuration determining the pitch attitude of the suspension, as shown. Distal end 28 defines opposed left and right laterally projecting tab continuations 32, 34 of the distal end, each having longitudinally separated, adjacent proximate and distal portions 321, 322 and 341, 342, respectively. The tab continuation proximate and distal portions 32, 34 are relatively adjustable to vary the distal end 28 configuration in suspension pitch attitude adjusting relation. The tab continuation proximate and distal portion pairs 321, 322, and 341, 342 are separately adjustable within each pair to vary the distal end configuration in suspension pitch attitude adjusting relation, The presence of the tab continuations 32, 34 tends to stiffen the suspension 10 and/or flexure 12. Thus, in accordance with the invention, each tab continuation 32, 34 is disposed within a generally rectangular perimeter 323, 343, respectively, and each tab continuation has within its respective perimeter a localized reduction in mass (described hereinafter), in suspension stiffness reducing relation, and in some cases defining and separating the members of each pair of portions 321, 322 and 341, 342.

Preferably each tab continuation 32, 34 is formed of the same web of metal as the metal support member 24. In a further preferred embodiment, shown in FIGS. 2–4, the flexure metal support member distal end 28 comprises a frame 36 having longitudinally extended left and right outriggers 38, 42 joined by a cross member 44 typically at the distal ends 46, 48 of the outriggers. A tongue 52 is cantilevered from the cross member 44 and supports slider 50. Outriggers 38, 42 define the left and right tab continuations 32, 34, respectively. Insulative film 22 is typically a polyimide film. Trace conductors 18 are preferably a highly conductive copper metal. The metal support member 24 and the load beam 12 where present each comprise a spring stainless steel.

Figure 4:
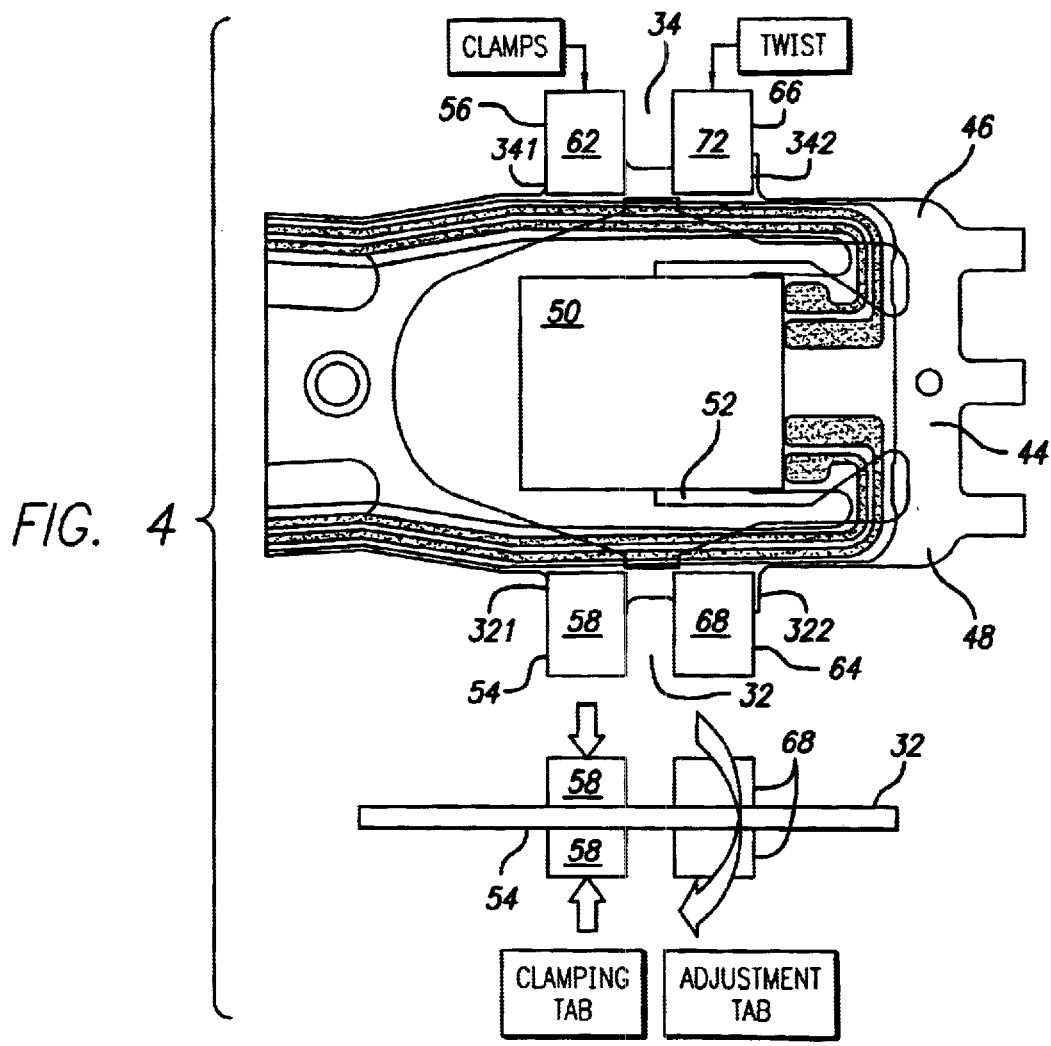
FIG. 4 is a bottom plan and a partly schematic view of the suspension during adjustment in accordance with the invention.

With particular reference to FIG. 4, the tab continuation proximate portions 321, 341 define clamping areas 54, 56 for attachment of a pair of stationary clamps 58, 62. The tab continuation distal portions 322, 342 define clamping areas 64, 66 for a pair of movable clamps 68, 72.

Adjustment of the suspension 10 pitch static attitude according to the invention involves grasping the proximate portions 321, 341 with clamps 58, 62, grasping the distal portions 322, 342 with the clamps 68, 72 and shifting the movable clamps to effect a bending or twisting of the suspension between the stationary and movable clamps, as schematically depicted in FIG. 4. The bending or twisting between the clamp pairs 58, 62 and 68, 72 is used to bring the tongue 52 to an orientation such that the tongue will be parallel to an opposing disk surface 13, the slider 50 will be parallel where the tongue is parallel.

Because, as noted, the tab continuations 32, 34 tend to make the suspension 10 stiffer than desired, the invention removes material from the tab continuations to reduce their mass, their thickness, or to otherwise minimize their effect on suspension stiffness.

Figure 2A:
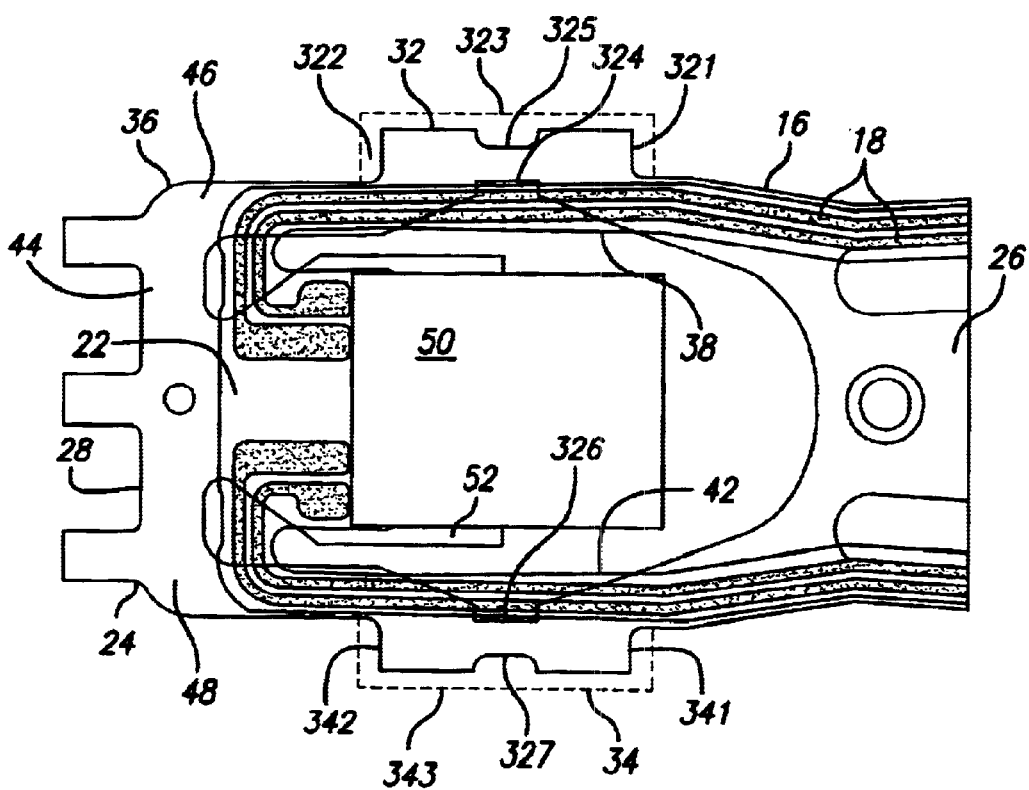
FIG. 2A is a bottom plan view of a suspension according to the invention.
Figure 2B:
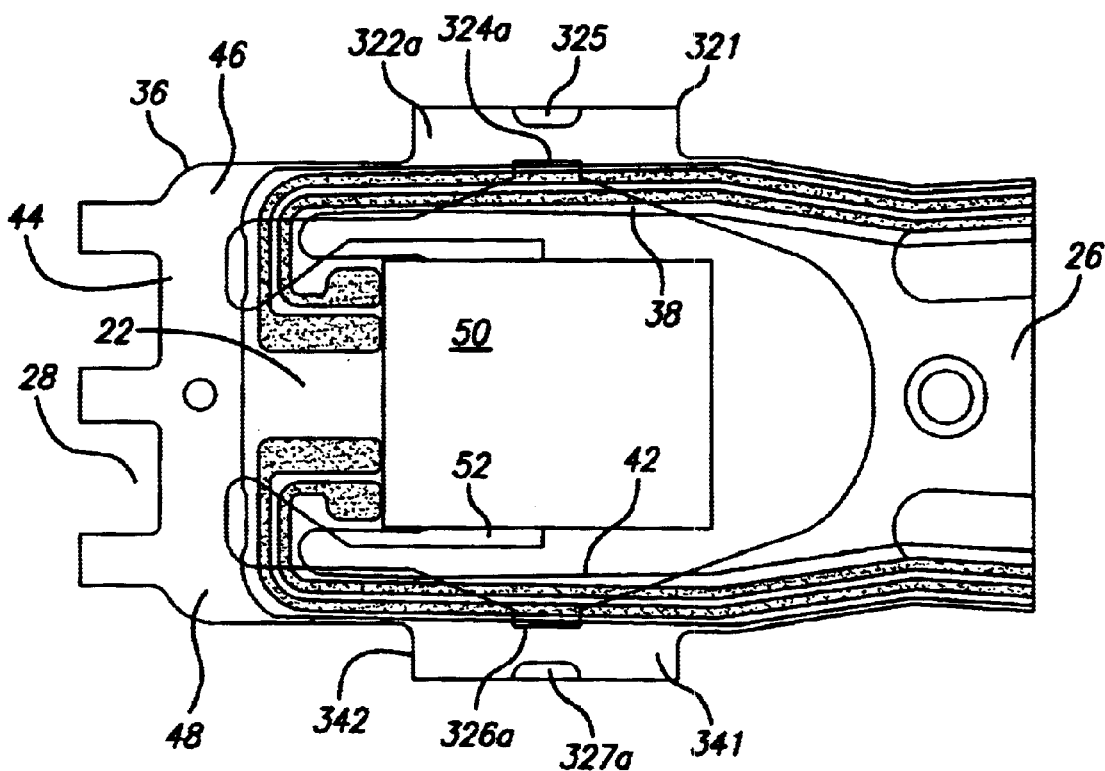
FIG. 2B is a bottom plan view of an alternative embodiment of the invention.

In FIG. 2A, the tab continuations 32, 34 are provided with inboard and outboard notches 324, 325 and 326, 327, respectively, between the distal and proximate portions 321, 322, and 341, 342, as shown. While these or other notches can be otherwise located, the arrangement shown is preferred. As shown in FIG. 2B, the notches 324a–327a can be only partially through the portions 321–342 rather than entirely through, e.g. by limiting etching, for example, to only locally reduce the thickness of the tab continuations 32, 34 in a notch pattern as shown, or as partial apertures within the portions (compare FIG. 3).

Tab continuation distal and proximate portions 321–342 after the notching at 324 and/or 327 comprise separated fingers projecting laterally from the metal support member 24, the adjacent fingers being defined and separated by a localized partial or through relief, e.g. full or partial notches or apertures in the tab continuation 32 or 34.

Figure 3:
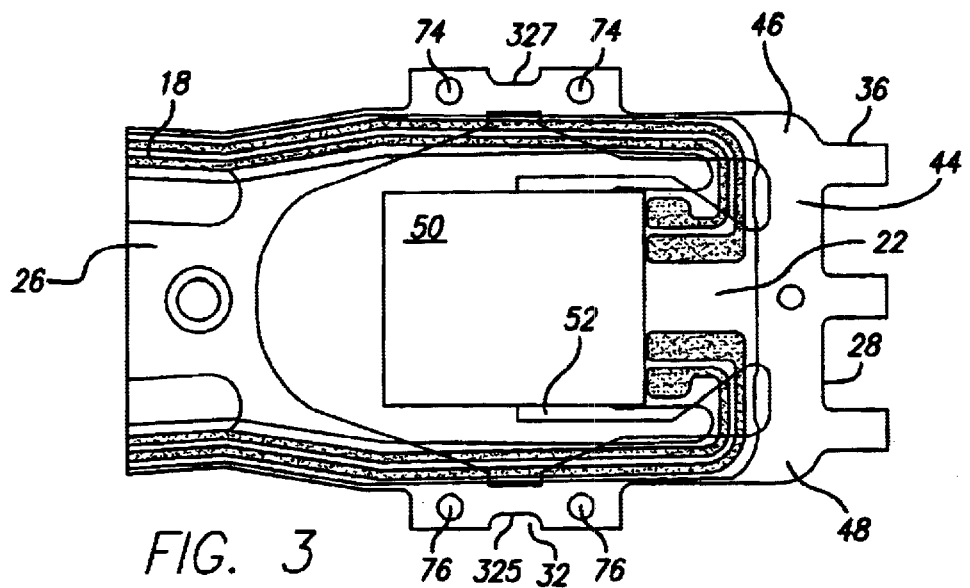
FIG. 3 is a bottom plan view of an invention suspension in a further alternate embodiment.

With reference to FIG. 3, the tab continuation distal and proximate portions 321–342 are provided with further localized mass reduction by opening full or partial apertures 74, 76 in the portions.

The invention method of adjusting the pitch static attitude of disk drive suspension 10 having a flexure 12 comprising a frame 36 with left and right longitudinally extending outriggers 38, 42, a cross member 44 connecting distal ends of the outriggers and a tongue 52 carried in cantilevered relation from the cross member so as to be parallel with an opposing disk surface 13 when the suspension pitch static attitude is properly adjusted includes defining first and second lateral tab continuations 32, 34 of the outriggers each having spaced, longitudinally adjacent distal and proximate portions 321, 322, 341, 342 locally reducing the mass of the tab continuations to lower the stiffness of the suspension, fixing the proximate portions of the tab continuations at laterally opposed first location areas 54, 56, gripping the distal portions of the tab continuations at laterally opposed second location areas 64, 66, deflecting and bending the flexure between the first and second locations by the gripped distal portions against the restraining force of the fixed proximate portions to bring the pitch attitude of the suspension to a value at which the tongue will be parallel to a the disk surface. In specific embodiments of the invention method, the mass of the tab continuations 32, 34 is locally reduced, as by outboard or inboard and outboard notching between the proximate and distal portions 321, 322 and 341 and 342, the proximate portions 321, 341 are located rearwardly of the cross member 44 and the distal portions 322, 342 forwardly of the cross member. Further, a gap or notch 325, 327 is provided between the proximate and distal portions 321–327 or aperture, 74, 76 are provided in the proximate and distal portions in suspension stiffness reducing relation.

The invention achieves pitch static attitude adjustment of a suspension that brings the suspension flexure tongue into parallel position with an opposing disk surface through relative bending or twisting of the suspension flexure metal layer by integral lateral tabs while avoiding suspension stiffness increase normally accompanying the presence of such adjustment tabs. The present suspension and manufacturing adjustment method provide a facile adjustment of pitch static attitude and, by locally reducing the mass of the tabs, avoids adding stiffness to the suspension.

The foregoing objects are thus met.

We claim:

1. A low stiffness pitch adjustable suspension comprising a flexure and a flexure support, said flexure comprising a flexible circuit assembly of trace conductors, an insulative film and a metal support member for said assembly insulated from said trace conductors by said insulative film, said metal support member having a proximate end and a distal end, said distal end having a configuration determining the pitch attitude of said suspension, said distal end defining opposed left and right laterally projecting tab continuations of said distal end having proximate and distal portions, said tab continuation proximate and distal portions being relatively adjustable to vary said distal end configuration in suspension pitch attitude adjusting relation, said tab continuations tending to stiffen said suspension, each said tab continuation being disposed within a generally rectangular perimeter, and each said tab continuation having within its said perimeter a local reduction in mass in suspension stiffness reducing relation.

2. The low stiffness pitch adjustable suspension according to claim 1, in which each said tab continuation is formed of the same web of metal as said metal support member.

3. The low stiffness pitch adjustable suspension according to claim 1, in which said suspension further comprises a load beam supporting said flexure metal support member.

4. The low stiffness pitch adjustable suspension according to claim 1, in which said flexure metal support member distal end comprises a frame having longitudinally extended left and right outriggers joined by a cross member and having a tongue cantilevered from said cross member, said outriggers defining said left and right tab continuations respectively.

5. The low stiffness pitch adjustable suspension according to claim 1, in which said insulative film is a polyimide film.

6. The low stiffness pitch adjustable suspension according to claim 1, in which said tab continuation proximate portions define clamping areas for stationary clamps, and said tab continuation distal portions define clamping areas for movable clamps, whereby said tab continuation distal portions when clamped are shiftable relative to said tab continuation proximate portions to vary said metal support member distal end configuration and said suspension pitch attitude thereby.

7. The low stiffness pitch adjustable suspension according to claim 6, in which said tab continuations are locally mass reduced in region between their said proximate and distal portions.

8. The low stiffness pitch adjustable suspension according to claim 7, in which said tab continuations are locally surface-relieved in said region, thereby to reduce said tab continuation mass.

9. The low stiffness pitch adjustable suspension according to claim 7, in which said tab continuations are locally through-relieved in said region, thereby to reduce said tab continuation mass.

10. The low stiffness pitch adjustable suspension according to claim 7, in which said tab continuation distal and proximate portions comprise separated fingers projecting laterally from said metal support member, adjacent fingers being defined and separated by a localized through relief in said tab continuation.

11. A low stiffness pitch adjustable suspension comprising a flexure and a flexure support, said flexure comprising a flexible circuit assembly of trace conductors, an insulative film and a spring metal support member for said assembly insulated from said trace conductors by said insulative film, said metal support member having a proximate end and a distal end, said distal end having a configuration determining the pitch attitude of said suspension, said distal end defining opposed left and right laterally projecting tab continuations of said distal end having longitudinally separated proximate and distal portions, said tab continuation proximate and distal portions being separately adjustable to vary said distal end configuration in suspension pitch attitude adjusting relation, said tab continuations tending to stiffen said suspension, each said tab continuation being disposed within a generally rectangular perimeter, and each said tab continuation having within its said perimeter a local reduction in mass in suspension stiffness reducing relation, said localized mass reduction defining and separating said longitudinally separated proximate and distal portions.

12. The low stiffness pitch adjustable suspension according to claim 11, in which each said tab continuation is formed of the same web of metal as said metal support member.

13. The low stiffness pitch adjustable suspension according to claim 12, in which said suspension further comprises a load beam supporting said flexure metal support member.

14. The low stiffness pitch adjustable suspension according to claim 12, in which said flexure metal support member distal end comprises a frame having longitudinally extended left and right outriggers joined by a cross member and having a tongue cantilevered from said cross member, said outriggers defining said left and right tab continuations respectively, said suspension being adjusted to bring said tongue to a position to be substantially parallel to a disk drive suspension disk.

15. The low stiffness pitch adjustable suspension according to claim 14, in which said insulative film is a polyimide film.

16. The low stiffness pitch adjustable suspension according to claim 14, in which said tab continuation proximate portions define clamping areas for stationary clamps, and said tab continuation distal portions define clamping areas for movable clamps, whereby said tab continuation distal portions when clamped are shiftable relative to said tab continuation proximate portions to vary said metal support member distal end configuration and said suspension pitch attitude thereby.

17. The low stiffness pitch adjustable suspension according to claim 16, in which said tab continuations are locally mass reduced in region between their said proximate and distal portions.

18. The low stiffness pitch adjustable suspension according to claim 17, in which said tab continuations are locally surface-relieved in said region, thereby to reduce said tab continuation mass.

19. The low stiffness pitch adjustable suspension according to claim 17, in which said tab continuations are locally through-relieved in said region, thereby to reduce said tab continuation mass.

20. The low stiffness pitch adjustable suspension according to claim 17, in which said tab continuation distal and proximate portions comprise separated fingers projecting laterally from said metal support member, adjacent fingers being defined and separated by a localized through relief in said tab continuation.

21. A method of adjusting the pitch static attitude of a disk drive suspension having a flexure comprising a frame with left and right longitudinally extending outriggers, a cross member connecting distal ends of said outriggers and a tongue carried in cantilevered relation from the cross member so as to be parallel with an opposing disk surface when the suspension pitch static attitude is properly adjusted, said method including defining first and second lateral tab continuations of said outriggers each having spaced, longitudinally adjacent distal and proximate portions, locally reducing the mass of said tab continuations to lower the stiffness of said suspension, fixing said proximate portions of said tab continuations at laterally opposed first locations, gripping said distal portions of said tab continuations at laterally opposed second locations, deflecting and bending said flexure between said first and second locations by the gripped distal portions against the restraining force of said fixed proximate portions to bring the pitch attitude of said suspension to a value at which said tongue will be parallel to a said disk surface.

22. The method of adjusting pitch attitude according to claim 21, including also locally reducing the mass of said tab continuations between said proximate and distal portions.

23. The method of adjusting pitch attitude according to claim 22, including also locating said proximate portion rearwardly of said cross member, locating said distal portion forwardly of said cross member, and defining a gap between said proximate and distal portions in suspension stiffness reducing relation.

24. The method of adjusting pitch attitude according to claim 21, including also supporting said flexure with a load beam.

* * * * *